United States Patent [19]
Van Tran et al.

[11] Patent Number: 5,723,985
[45] Date of Patent: Mar. 3, 1998

[54] CLOCKED HIGH VOLTAGE SWITCH

[75] Inventors: Hieu Van Tran, San Jose; Trevor Blyth, Milpitas; Richard T. Simko, Los Altos Hills, all of Calif.

[73] Assignee: Information Storage Devices, Inc., San Jose, Calif.

[21] Appl. No.: 590,267

[22] Filed: Nov. 21, 1995

[51] Int. Cl.$^6$ ............................................. H03K 19/0175
[52] U.S. Cl. .......................... 326/81; 326/68; 326/83; 327/333; 327/589
[58] Field of Search .................... 326/68, 80–81, 326/83, 86, 121, 95, 98; 327/333, 390, 536, 589; 257/400–401, 399, 398

[56] References Cited

U.S. PATENT DOCUMENTS

| | | | |
|---|---|---|---|
| 4,511,811 | 4/1985 | Gupta . | |
| 5,136,190 | 8/1992 | Chern et al. . | |
| 5,248,907 | 9/1993 | Lin et al. | 326/83 |
| 5,319,604 | 6/1994 | Imondi et al. | 326/62 |
| 5,559,464 | 9/1996 | Orii et al. . | |
| 5,587,671 | 12/1996 | Zagar | 326/88 |
| 5,641,982 | 6/1997 | Takahashi | 257/400 |

FOREIGN PATENT DOCUMENTS

| | | |
|---|---|---|
| 62-204574 | 9/1987 | Japan . |
| 3-21056 | 1/1991 | Japan . |
| 6-132526 | 5/1994 | Japan . |
| 6-152383 | 5/1994 | Japan . |

OTHER PUBLICATIONS

*High Voltage Regulation and Process Consideration for High–Density 5 V–Only E2PROM's*, Duane H. Oto et al., IEEE Journal of Solid–State Circuits, vol. SC–18, No. 5, Oct. 1983.

*Primary Examiner*—Jon Santamauro
*Attorney, Agent, or Firm*—Blakely, Sokoloff, Taylor & Zafman

[57] ABSTRACT

The present invention discloses methods and apparatus for implementing a clocked high voltage switch involving MOS devices. The switching is from a high voltage source typically at 21V to ground. An intermediate voltage source typically at 11V is introduced for reducing the gated breakdown voltage requirement to approximately 10V. This reduced gated breakdown voltage requirement is easily met by special layout methods applied to various transistors in the circuit. The basic layout methods include the terminating of the field implant region near the N+P junction to expose the N+ diffusion over the P substrate to increase the junction breakdown and the gated diode breakdown, and the use of short channel length to reduce the threshold voltage.

26 Claims, 7 Drawing Sheets

CLOCKED HIGH VOLTAGE SWITCH

BACKGROUND OF THE INVENTION

1. Field of the Invention

This invention relates to the field of MOS integrated circuits relating to the high voltage switching in non-volatile memory devices.

2. Prior Art

In non-volatile memory integrated circuits, a high voltage, higher than the normal power supply voltage, is usually required on-chip to allow some basic memory cell operations such as Fowler-Nordheim tunneling or channel hot electron programming. During programming, the select lines of the memory array must be able to switch between the high voltage and ground. One method is to use a clocked high voltage NMOS switch to reduce the current load on the high voltage source by using a clock coupling to a capacitor through a transfer transistor with a MOS diode as an isolation diode.

FIG. 1 shows a typical prior art switching circuit of the foregoing type. The input IN can assume two voltage levels, Vcc or ground (GND). Vcc is the power supply voltage which is typically 5V. The high voltage source VHV is at the VHV (very high voltage) level, typically 21 volts. The output OHV can assume two voltage levels, VHV and GND. The clock input PHI is used to pump the internal node HVOUT to a high level. HVOUT, applied to the gage of M7, connects to VHV to the output OHV without any loss of voltage. Transistors M5 and M6 are coupled as an inverter to invert input IN to control transistor M3. Transistor M4, while not absolutely necessary for the basic functionality of the circuit, serves to disconnect the clock PHI from the capacitor C1 when the input is low, thereby reducing the capacitive load on PHI. It also serves to reduce the current consumption from PHI through the M2 and M3 to ground when the input is low. Capacitor C1 is the coupling (pumping) capacitor for clock PHI. Transistor M2 is connected as a diode to isolate the output HVOUT from the clock PHI. Transistor M1 is used as a bootstrap and transfer device to transfer the high voltage VHV to the output HVOUT. Transistor M8 is used as a pull-down device to short the output to GND under the control of the input IN.

The circuit operates as follows:

When the input IN is at Vcc, the transistor inverter pair M5 and M6 turns off transistors M3 and M8. At the same time, transistor M4 is enabled, letting clock signal PHI pass. The clock signal has HIGH and LOW intervals. During the low to high transition of the clock input PHI, the capacitor C1 couples charge to the gate and drain of M2. The transistor M2, in this connection configuration, behaves like a forward biased diode and charge is conducted through M2 onto node HVOUT, the gates of transistors M1 and M7. During the high to low transition of PHI, the gate voltage of M2 is reduced, thereby turning M2 off, and the charge that was transferred during the previous cycle remains on the gates of M1 and M7. The source voltage of M1 is reduced, yet there is very little reduction in its gate voltage. M1 now conducts and transfers charge from VHV onto the capacitor. The negative voltage transition at the source of M1 is therefore reduced, so that on the next low to high transition of PHI there is a net increase in the voltage of HVOUT. Therefore, at each clock cycle, HVOUT continues to rise until it is one threshold voltage above VHV at which time transistor M1 is completely turned on, connecting the gate-source of diode M2 to VHV. The same voltage exists on the gate of M7 and hence, VHV is connected to the output OHV without voltage loss.

When input IN is at LOW voltage level (GND), transistor inverter pair M5 and M6 turns on transistors M3 and M8. At the same time, transistor M4 is disabled, decoupling the capacitor from the clock PHI. Output HVOUT is pulled down to GND, turning off transistor M1, and causing diode M2 to discharge its gate to one threshold above GND. M7 is turned off, disconnecting VHV from OHV. M8 is turned on by the inverter M6 and M5, pulling OHV to GND.

Two problems exist with the above circuit. First, the voltage transition at the gate of M2 must be sufficiently large to overcome the sum of the threshold voltages of transistors M1 and M2 to allow a net increase in the HVOUT voltage during a low to high transition of PHI. If the sum of these threshold voltages is high, the transition voltage at M2 must also be high. The voltage level VCC must be correspondingly high, resulting in high power supply voltage for satisfactory operation of the circuit. Since transistors M1 and M2 are subject to high voltages, their source nodes experience high amounts of body effect, which causes their threshold voltages to be as high as 2V or more for a VHV level of about 15V. These thresholds, together with threshold voltage of about 1V of transistor M4, results in at least a VCC of 5V for satisfactory circuit operation. Secondly, transistors M1, M3, M7 and M8 are required to support high voltages on their drains while their gate voltages are at GND. This phenomenon is referred to as the gated diode breakdown. This occurs at M1 and M7 when they are in a non-conductive state, i.e., their gates are at GND, and at transistor M3 and M8 when they are in a non-conductive state while output HVOUT and VHV are at a high voltage level. Therefore, they require very high gated breakdown voltages. For M1 and M7 and M8 it is VHV, for M3 it is VHV+VT. Moreover, their drain and source junctions have to sustain corresponding high voltages as described above. This is referred to as the junction breakdown phenomenon. These are the two problems that the present invention intends to overcome.

Another conventional clocked high voltage switch is described in U.S. Pat. No. 4,511,811 ("the '811 patent") issued to Anil Gupta. In that patent, various breakdown mechanisms, as in the conventional circuit described earlier, still occur. In addition, the performance of the pumping action in the '811 patent is a direct function of the ratio of the pumping capacitance to loading capacitance. In an extreme case, the loading capacitance is so large that it takes an infinite amount of time to work. Moreover, the switch described in the '811 patent transfers the charge from the high voltage source directly to the output, i.e., the distributed capacitance wordline as in the conventional circuit described earlier. No buffering is provided.

In the '811 circuit, the final voltage on the output, i.e., the distributed capacitance wordline, is at least one native VT higher than the high voltage source depending on the voltage swing of the oscillator. This is not desirable because the voltage level of the high voltage source is already regulated for reliability reasons. Conventional switches also utilize an enhancement NMOS as the pumping capacitor, which causes the switch to work less effectively when supplied with lower levels of power supply due to the requirement that a minimum voltage of 2 native VT plus 1 enhancement VT is needed to start the pumping action. In addition, if the pumping capacitor in a switched circuit uses a native NMOS, then current through the pumping capacitor to the ground is wasted when the native NMOS is unselected. In that case, additional and heavy capacitance loading to the oscillator exists, since all the pumping capacitances are connected to the same oscillator.

It is therefore desirable to have a circuit that employs low voltage NMOS transistors that work at a low power supply with optimally utilized area. It is also desirable to utilize an enabled NMOS coupled to the pumping capacitor, so that if the NMOS is disabled, there is no voltage coupling from the oscillator and there is no capacitive loading to the oscillator from the unselected switches.

BRIEF SUMMARY OF THE INVENTION

The present invention achieves a clocked high voltage switch with the following two objectives: (1) to utilize low voltage NMOS transistors, and (2) to lower the power supply voltage.

These objectives are achieved by using a medium voltage source and medium voltage buffer, and special layout techniques to exploit the short channel effect. More specifically, a voltage level-shifting scheme using an intermediate voltage source is used to distribute the high voltage almost equally among the NMOS transistors so that these transistors can meet the device electrical specifications of regular low voltage NMOS devices for various breakdown mechanisms. Where the transistors are still subject to high voltage switching, special layout techniques are used to provide a much higher junction breakdown of N+ to P− junctions and a better gated diode breakdown with optimal device area utilization.

DETAILED DESCRIPTION OF THE INVENTION

In accordance with the present invention, a medium voltage level (MHV) is introduced to reduce the breakdown voltage requirements of devices in a clocked high voltage switch. In addition, special layout techniques are employed to raise the junction breakdown to much higher than the high voltage source level, typically 21V. For low voltage transistors (NMOS and PMOS), the gated diode breakdown voltage and the junction breakdown voltage are approximately 15V and 16V, respectively. Therefore, breakdown voltages greater than these values are required to support a high voltage of, say, 21V.

Figure 1:
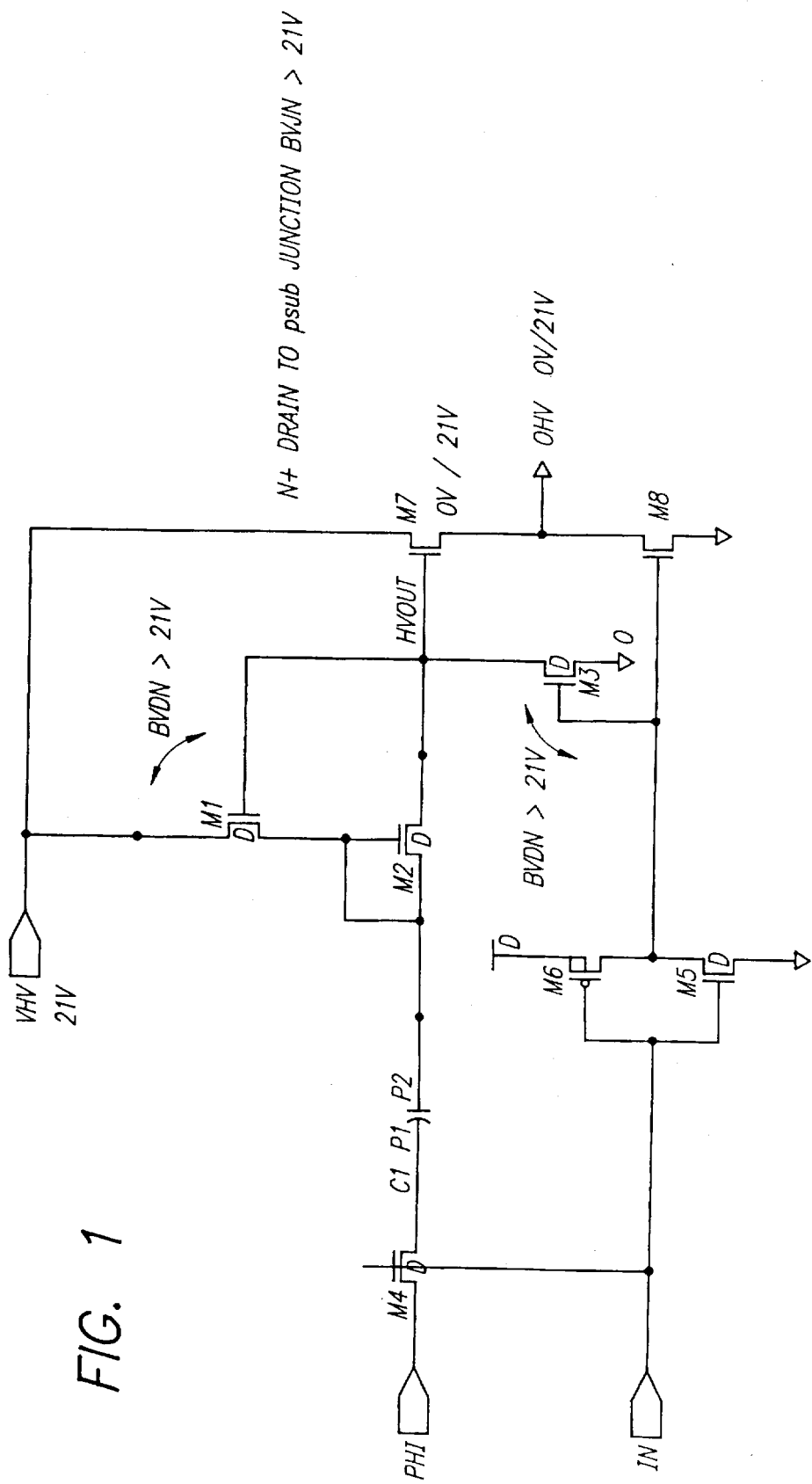
FIG. 1 is a circuit diagram illustrating the prior art clocked high voltage switch.
Figure 2:
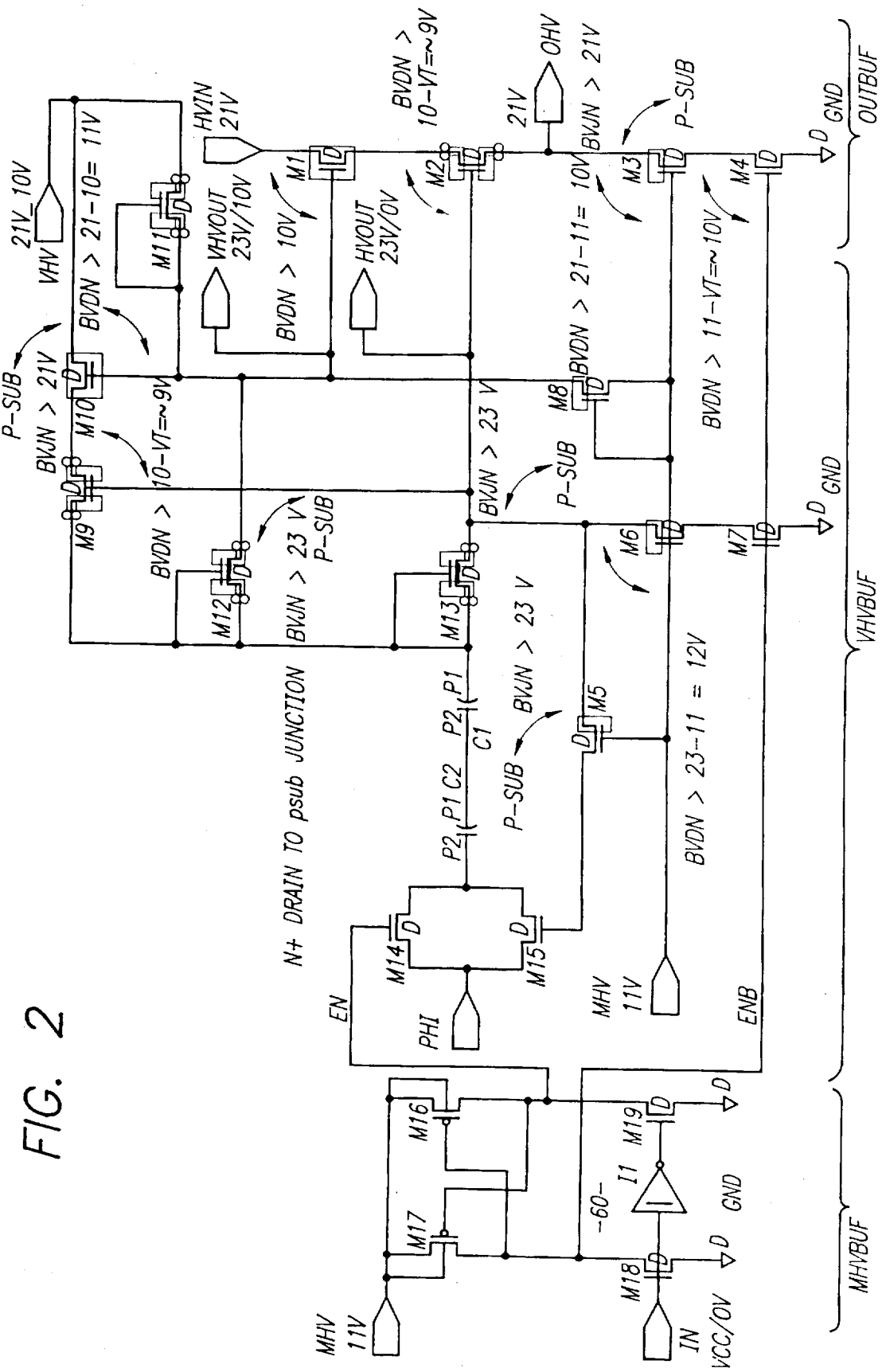
FIG. 2 is a circuit diagram of a preferred embodiment of the present invention.

The present invention is best described by describing a typical preferred embodiment, shown in FIG. 2. In this Figure, the input IN is a regular input which assumes two voltage levels, VCC and GND. The high voltage source VHV is typically 21V. The medium voltage source MHV is typically 11V. This value is selected so that it does not violate any breakdown mechanism of the regular low voltage circuits, as regular low voltage circuits are used to generate control signals for the medium voltage source MHV. The output OHV will be at VHV and GND when input IN is at VCC and GND, respectively.

Transistors M16, M17, M18, M19 and inverter 60 are optional. They act as a medium voltage buffer between the medium voltage source MHV and other parts of the circuit. Transistor M14 is used as a pass transistor to pass clock PHI as enabled by the input signal IN through cross coupled transistors M16, M17, M18 and M19. The medium voltage buffer allows transistor M14 to pass a maximum of MHV−VT−10V, where VT is the threshold voltage of transistor M14. The additional transistors M15 and M5 are optional, and provide more conduction when the circuit is in a charge pumping action. Poly-poly capacitors C1 and C2, in series to avoid the poly poly oxide breakdown, perform the coupling function. Diode connected transistors M12 and M13 act as isolation diodes, with almost zero threshold voltage, for increasing charge transfer efficiency.

Transistors M9 and M10 serve to transfer charge from VHV to the source of M9 during the negative transition of PHI. Diode M11 is used to discharge VHVOUT when VHV goes low and to limit the maximum level of VHVOUT to avoid overstress of gate oxides. Transistor M8 is to keep VHVOUT at about MHV−VT (which is approximately 10V for an MHV value of 11V and VT of 1V) to avoid gated diode breakdown to transistors M1 and M10 when the switch is OFF.

Transistors M6 and M7 act as pull-down devices to pull terminal HVOUT to GND. The gate of transistor M6 is connected to the medium voltage MHV for buffering M6 against the gated diode breakdown when the switch is ON. Transistors M1, M2, M3, and M4 act as the output buffer for output OHV. Transistors M1 and M2 are pull-up devices to pass the high voltage HVIN and M3 and M4 are pull-down devices to GND. It can be seen that by using a medium voltage level to shift the high voltage down to a manageable level, the gated diode breakdown requirement is only at approximately 11V, which is easily met by standard MOS process.

The circuit operates as follows:

When input IN is at VCC, transistor M18 is ON pulling ENB to GND and turning ON transistor M16, allowing MHV to pass to EN which in turn turns off transistor M17. The gate of transistor M19 is LOW because the inverter 60 complements the HIGH level of input IN. Transistor M19 is therefore OFF preventing EN from being shorted to GND. EN then assumes the voltage level of MHV turning on transistor M14. At the same time, ENB is LOW, turning off transistors M7 and M4. Transistors M6 and M3 act as a buffer between GND and HVOUT and OHV, respectively. Since their gates are connected to MHV of about 11V, they see only a maximum gate-to-drain voltage of between 10V to 12V. Now, transistor M14 is ON while transistor M7 is OFF. Clock PHI is allowed to pass through to start the pumping action to raise the voltage levels at terminals HVOUT and VHVOUT.

First, HVOUT is pumped from zero to 10V, then both HVOUT and VHVOUT are pumped together. Eventually, both HVOUT and VHVOUT rise to one threshold voltage above VHV, i.e. approximately 23V. HVOUT is pumped through transistors M9, M10, and M13. VHVOUT is pumped through transistors M9, M10, and M12. Transistor M5 is ON, connecting the gate of transistor M15 to HVOUT. After the initial pumping by PHI through M14 and M13, HVOUT rises, making transistor M15 conductive, providing additional conduction for the clock PHI. Transistors M1 and M2 are ON to allow the full high voltage of 21V to pass through output OHV. Therefore, output OHV is at a high voltage level of 21V when input IN is at VCC. Transistors M3, M5, M6 and M8 see a maximum gate-to-drain voltage of 23V−11V=12V. As described later in the layout method, these transistors are specially laid out to meet the junction breakdown requirement. Note that M12 could be made enhancement, M10 native, and M1 native. Operation of the circuit is still the same.

When input IN is at GND, transistor M18 is OFF. Inverter 60 complements the voltage and turns on transistor M19, pulling EN and the gate of transistor M17 to GND. Transistor M17 is ON, passing MHV to ENB and turning off transistor M16. EN is therefore disconnected from MHV and turns off transistor M14. At the same time, ENB assumes the voltage level of MHV, turning on transistors M7 and M4. Now, transistor M14 is OFF while transistor M7 is ON. Transistors M5, M6, and M7 pull the gate of transistor M15 to GND. Since both transistors M14 and M15 are OFF, clock PHI is not allowed to pass through. Terminal HVOUT is pulled down to GND due to transistors M6 and M7, turning off transistor M2. Output OHV is then pulled down to GND through transistors M3 and M4. Therefore, output OHV is at ground voltage level when input IN is at ground voltage level. Transistor M8 holds VHVOUT at one threshold voltage below the medium voltage MHV, i.e., VHVOUT is at approximately 10V. Diode M11 is reversed bias from VHV to VHVOUT. Transistor M9 is OFF because HVOUT is at GND. The gates of transistors M10 and M1 are both at approximately 10V; therefore, although their drains are at 21V, the gated breakdown requirement is only 11V, which is easily met by low voltage NMOS transistors. However, the junctions are still subjected to very high voltage. A simple layout will be described later to help it meet the requirement.

With an intermediate voltage level of 11V, several transistors can now sustain a much less gated breakdown voltage. The present invention also includes special layout techniques to improve junction breakdown voltage to corresponding junctions with very high voltage on them. The diffusion junction breakdown of N+ to P-substrate is met by pulling the boron field implant away from all the high voltage diffusion including the source, the drain and the interconnect diffusion. The boron field implant in a typical standard MOS process is normally positioned close to the overlapping N+ region. This technique increases the junction breakdown tens of volts and the gated diode breakdown a couple of volts.

In particular, the "H-shaped" channel structure layout technique, which will be described in more detail later, exploits the short channel length while still meets the high voltage requirement. The H-shaped channel structure refers to the channel of the MOS having the shape of the letter "H", that is, the channel is wider adjacent to the field regions as compared to a portion intermediate to the field regions. Transistors M2, M9, M11, M12 and M13 use this layout to reduce the threshold voltage VT which in turn helps to reduce the minimum VCC. For example, transistor M9 has a threshold voltage of about 1.5V at the body bias of 20V, transistor M13 has a threshold voltage of about 1.0V at the body bias of 20V. Therefore, the minimum VCC is 2.5V, which is much lower than that of the prior clocked high voltage switch (5V).

Figure 3A:
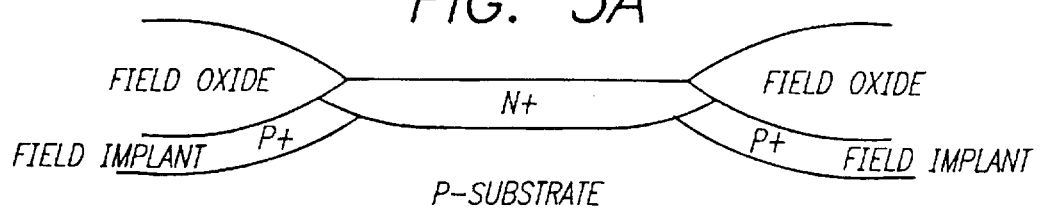
FIGS. 3A and 3B are diagrams illustrating the cross-section and top view respectively, of conventional N+ to P substrate junctions.
Figure 3B:
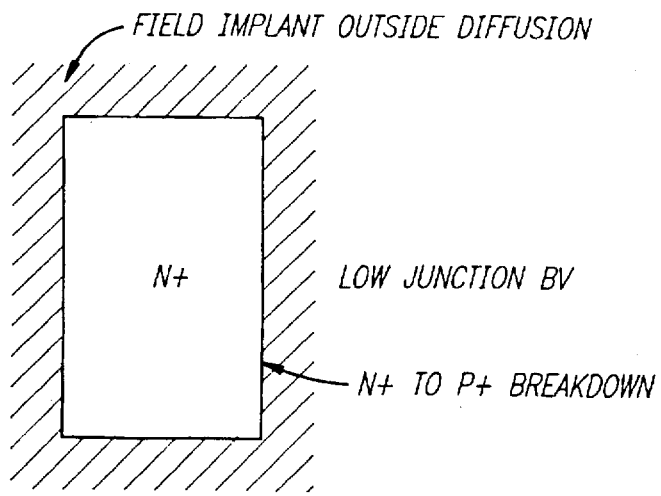

FIGS. 3A and 3B show the cross-section and top view of the conventional N+ P substrate junctions, respectively. The field implant is a boron implant used to raise the field threshold of the poly and metal field devices. However, this would lower the N+ P breakdown to the N+ P+ breakdown due to the implant diffusion.

Figure 4A:
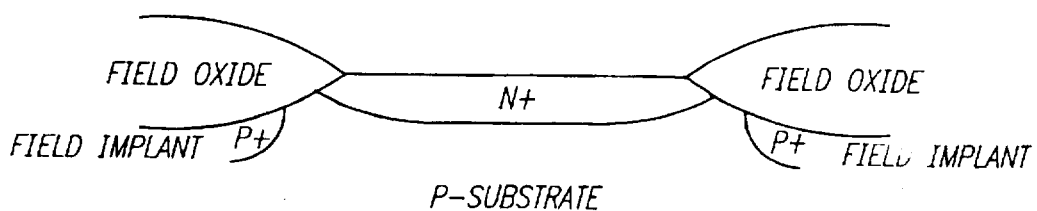
FIGS. 4A and 4B are diagrams illustrating the cross-section and top view respectively, improved N+ to P substrate junctions.
Figure 4B:
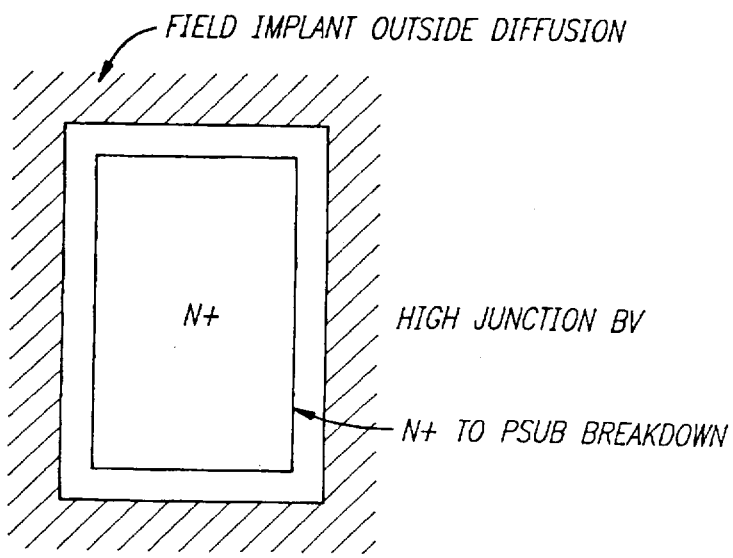

FIGS. 4A and 4B show the cross-section and top view of the present N+ P substrate junction, respectively. The field implant is terminated a short distance from the junction to expose the N+ diffusion over the P substrate only. Due to a much lower substrate doping of the P substrate, the junction breakdown increases in the order of a few tens of volts. This is more than enough to meet the breakdown requirement.

Figure 5A:
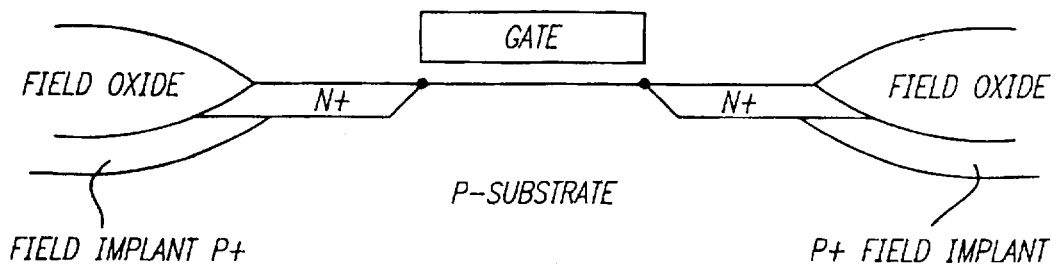
FIGS. 5A and 5B are diagrams illustrating the cross-section (taken along lines 5A—5A of FIG. 5B) and top view respectively, of a conventional NMOS transistor.
Figure 5B:
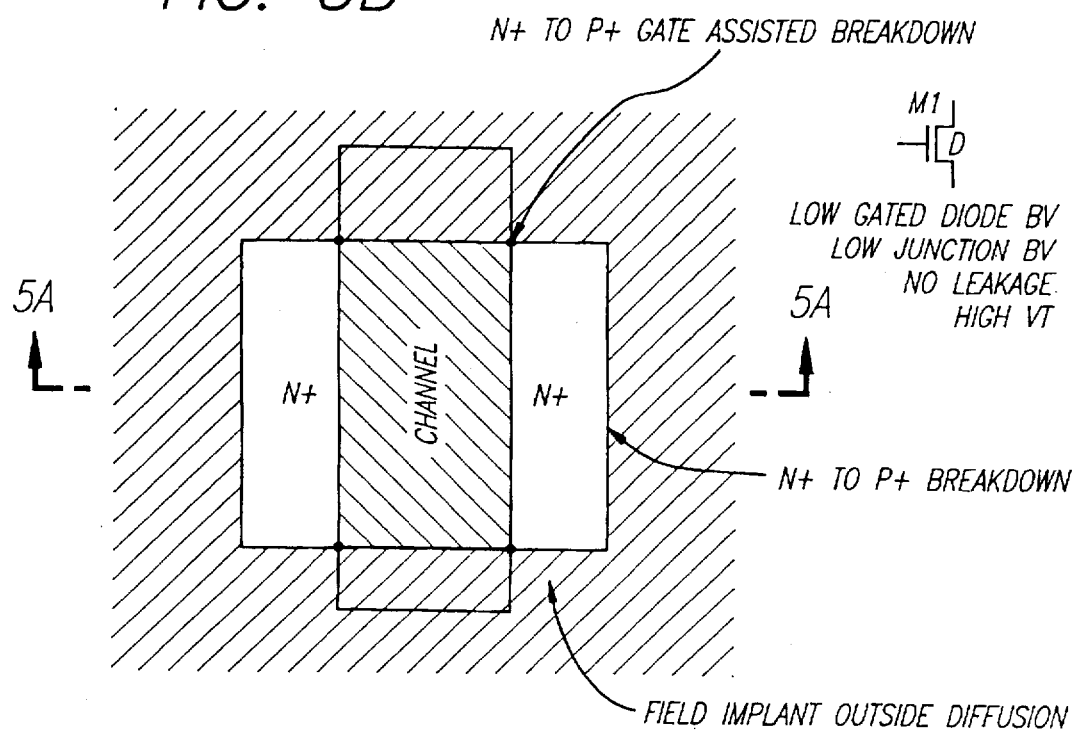

FIGS. 5A and 5B show the cross-section (taken along line 5A—5A of FIG. 5B) and top view of a conventional NMOS transistor, respectively. The same problem as in FIG. 3 exists with the source and drain junction breakdowns. In addition, at the edge of the channel and the field close to the source and drain junctions, the field implant also diffuses into the channel region underneath the gate, making the localized field much stronger. The result is a further reduced gated diode breakdown.

Figure 6A:
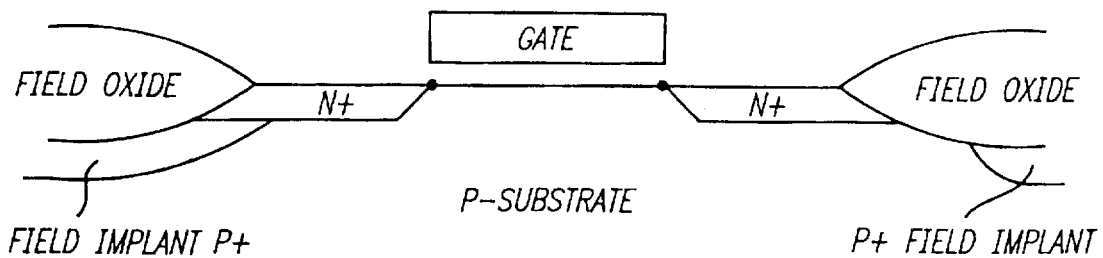
FIGS. 6A and 6B are diagrams illustrating the cross-section (taken along lines 6A—6A of FIG. 6B) and top view respectively, of the present NMOS transistor with increased junction breakdown on the drain only.
Figure 6B:
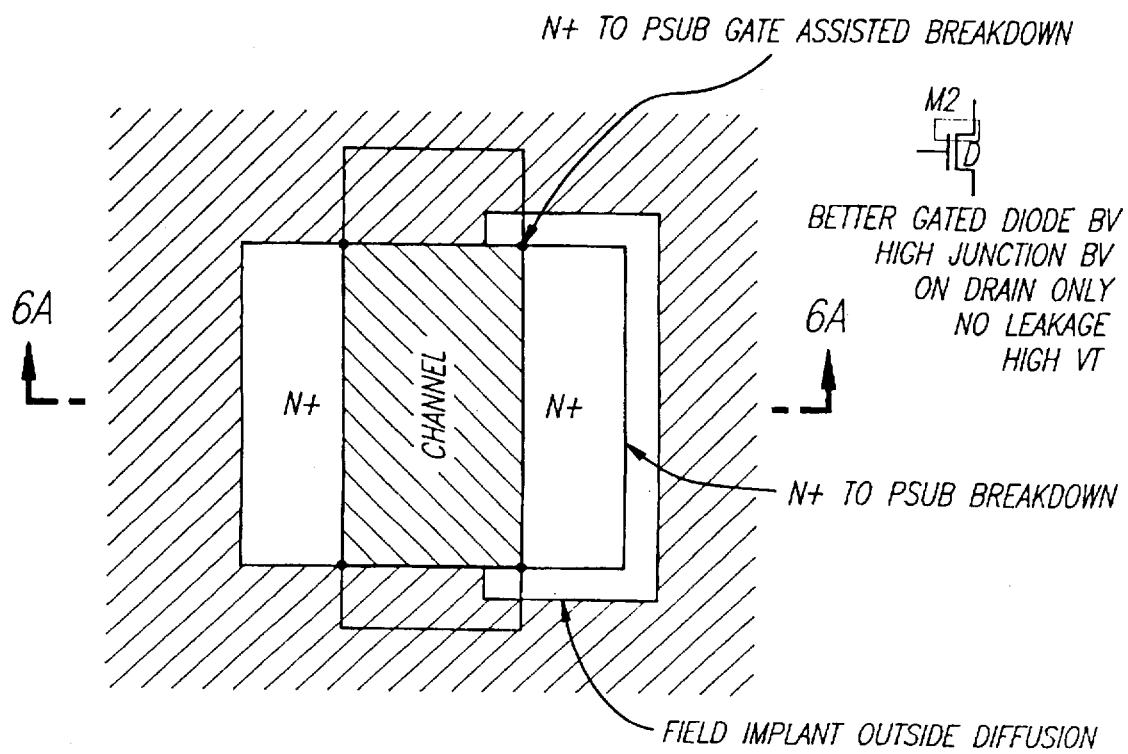

FIGS. 6A and 6B show the cross-section(taken along lines 6A—6A of FIG. 6B) and top view, respectively, of the present NMOS transistor with no field implant on the drain. This device is needed where the high voltage is present on the drain only (e.g., transistors M3, M5, and M6 in FIG. 2). Due to a much lower substrate doping of the P substrate, the junction breakdown increases in the order of few tens of volts. In addition, the gated diode breakdown also increases a couple of volts due to a softer junction between the channel and the drain at the intersection of the drain, the gate, and the field. The threshold voltage VT is of high level because the channel length is longer than normal.

Figure 7A:
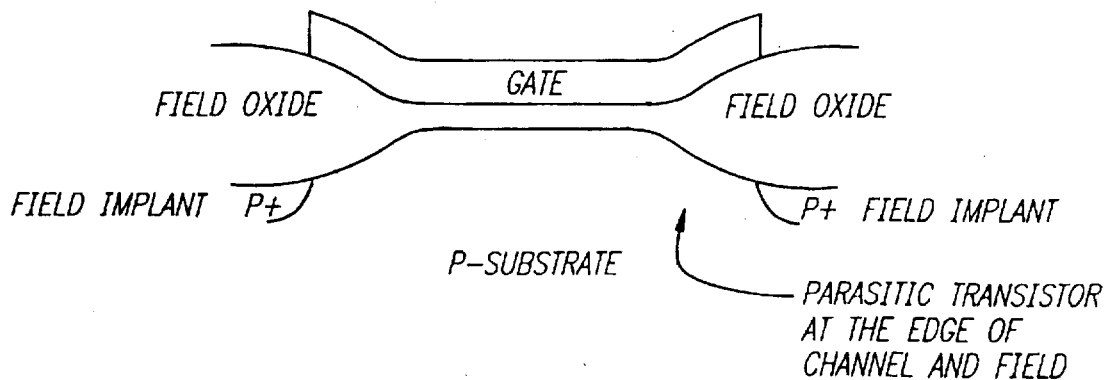
FIGS. 7A and 7B are diagrams illustrating the cross-section (taken along line 7A—7A of FIG. 7B) and top view respectively, of the present NMOS transistor with increased breakdown voltages on the entire device, but with leakage.
Figure 7B:
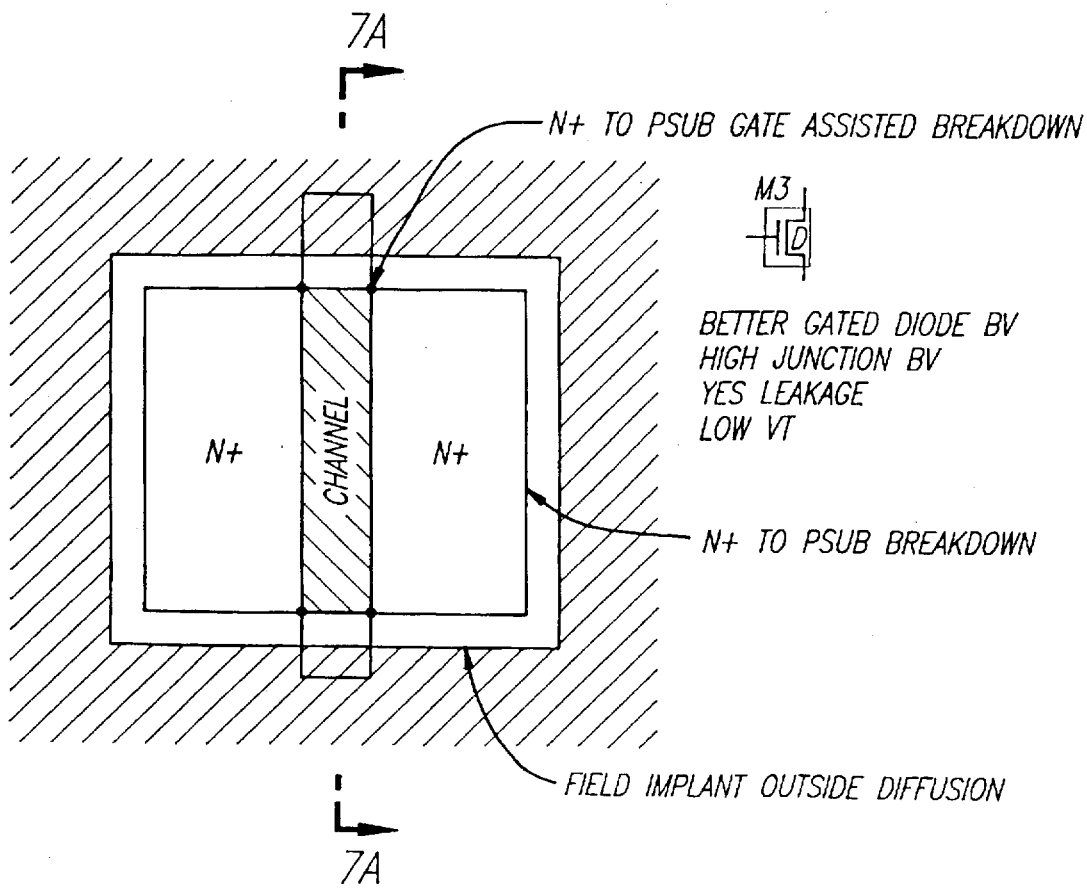

FIGS. 7A and 7B show the cross-section (taken along line 7A—7A of FIG. 7B) and the top view, respectively, of the present NMOS transistor with no implant over the entire device. Since there is no requirement of minimum spacing from field implant to the other diffusion junction, the channel length could be much shorter, resulting in a lower threshold voltage VT. There will be, however, a leakage from source to drain because the region at the intersection of the gate and field constitutes a native (no implant) NMOS field device. The increase in junction breakdown voltage and gated diode breakdown voltage will be the same as in FIG. 6. This type of device is suitable to buffer the high voltage without dropping a large threshold voltage, such as transistors M10 and M11 in FIG. 2, and leakage is not a problem.

Figure 8A:
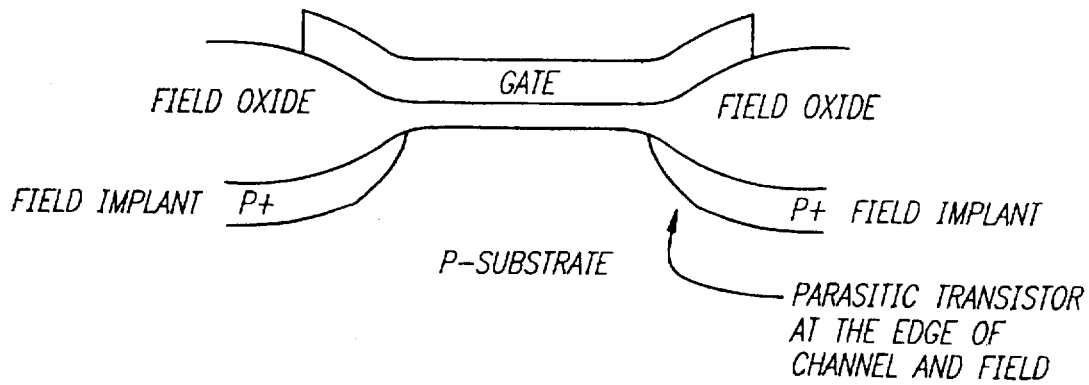
FIGS. 8A and 8B are diagrams illustrating the cross-section (taken along line 8A—8A of FIG. 8B) and top view respectively, of the present NMOS transistor with better breakdown voltages on the entire device and without leakage.
Figure 8B:
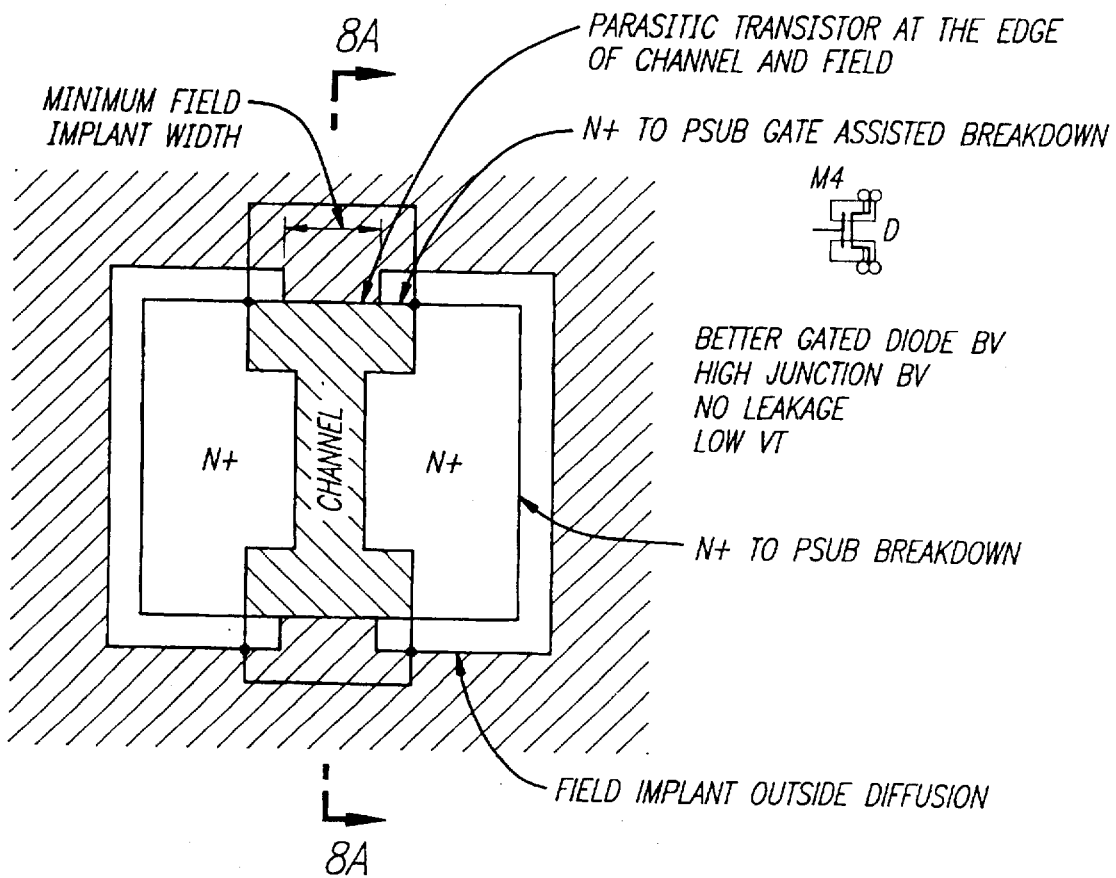

FIGS. 8A and 8B show the cross-section (taken along line 8A—8A of FIG. 8B) and the top view, respectively, of the "H-shaped" NMOS. The H-shaped channel structure refers to the channel of the MOS having the shape of the letter "H", that is, the channel is wider adjacent to the field regions as compared to a portion intermediate to the field regions. This type of device also has the field implant pulled back from (terminating short of) the source to drain to achieve the same increase in junction and gated diode breakdowns. To avoid leakage, the field implant terminates at the intersection of the channel and field. The spacings between the field implant to diffusion junctions, and between one field implant to another, create a large gate region at the intersection. The middle section of the gate is small for a short channel length. Therefore this device has low threshold voltage and no leakage. For example, in FIG. 2, transistors M2 and M9 are of this type.

Regarding the area needed for each transistor, the transistor in FIG. 7 requires the smallest area, the transistor in FIG. 8 requires the largest area, while the transistor in FIG. 6 requires an area in between that required by the transistors in FIGS. 7 and 8. By utilizing a combination of devices, the breakdown requirement is met with the optimal area usage.

Utilization of the present invention provides numerous advantages. Unlike conventional switches, the performance of the present invention is independent of the loading capacitance. While a conventional switch, such as that provided by the '811 patent, transfers the charge from the high voltage source directly to the output, i.e., the distributed capacitance wordline as described in the prior art patent, the present invention transfers the charge from high voltage source through a buffer NMOS to the output. In the '811 circuit, the final voltage on the output, i.e., the distributed capacitance wordline, is at least one native VT higher than the high voltage source depending on the voltage swing of the oscillator. On the other hand, in the present invention, the final voltage level on the output is precisely the high voltage source. This is important since the voltage level of the high voltage source is already regulated for reliability reasons.

Furthermore, a conventional switch also utilizes an enhancement NMOS as the pumping capacitor, which causes the switch to work less effectively at low supply voltage due to the requirement of a minimum voltage of 2 native VT plus 1 enhancement VT to start the pumping action. The present invention only requires a voltage of 1 native VT plus 1 enhancement VT to start. If the pumping capacitor uses a native NMOS, then current is provided through the pumping capacitor to ground when the native NMOS is unselected, thus wasting current. In that case, additional and heavy capacitance loading to the oscillator also exists, since all the pumping capacitances are connected to the same oscillator. The present invention uses an enabled NMOS coupled to the pumping capacitor, so that if the NMOS is disabled, there is no voltage coupling from the oscillator and there is no capacitive loading to the oscillator from the unselected switches.

Finally, while the clocked high voltage switch of the present invention has been disclosed and described with respect to preferred embodiment thereof, it will be understood that the apparatus and methods of the present invention may be varied without departing from the spirit and scope thereof.

What is claimed is:

1. A high voltage output level shifter using low voltage MOS devices comprising:

a first terminal for coupling to a first voltage source, a second terminal for coupling to a second voltage source, a third terminal for coupling to a third voltage source, a fourth terminal for coupling to a clock signal, and an output terminal, wherein said second voltage source is intermediate to said first and third voltage sources;

first, second, third and fourth devices, each having a source, a drain and a gate, said second device having a channel region between said source and drain of said second device, said second device having a field implant terminating short of said source and said drain of said second device, the field implant also terminating at the edge of said channel region, said drain of said first device being coupled to said first terminal, said source of said first device and said drain of said second device being coupled together, said source of said second device and said drain of said third device being coupled to said output terminal, said source of said third device and said drain of said fourth device being coupled together, said gate of said third device being coupled to said second terminal, said source of said fourth device being coupled to said third terminal;

an input circuit for providing an input signal;

a charge pump coupled to said input circuit and to said gates of said first and second devices for charging said gates of said first and second devices to a threshold voltage above that provided by said first voltage source in response to said input signal; and a circuit coupled to said input circuit and to said gates of said third and fourth devices for switching said third and fourth devices off in response to said input signal.

2. The high voltage output level shifter of claim 1 wherein said input circuit further comprises first and second output terminals, said second output terminal providing a signal complementary to a signal provided by said first output terminal.

3. The high voltage output level shifter of claim 1 wherein said charge pump comprises:

a fifth terminal for coupling to a fourth voltage source;

fifth, sixth, seventh and eighth devices each having a gate, a drain and a source, said drain of said fifth device being coupled to said fifth terminal, said source of said fifth device being coupled to said drain of said sixth device, said gate and said drain of said seventh device being coupled to said source of said sixth device, said source of said seventh device being coupled to said gate of said fifth device and to said gate of said first device, said gate and said drain of said eighth device being coupled to said source of said sixth device, said source of said eighth device being coupled to said gate of said sixth device and to said gate of said second device; and a capacitor having a first terminal and a second terminal, said first terminal of said capacitor being coupled to said fourth terminal and said second terminal of said capacitor being coupled to said gate and drain of said eighth device.

4. The high voltage output level shifter of claim 3, wherein said sixth, seventh and eighth devices each having a channel region between said source and drain, and a field implant terminating short of said source and said drain, the field implant also terminating at the edge of said channel region.

5. The high voltage output level shifter of claim 4 further comprising sixth and seventh terminals coupled to said gates of said first and second devices respectively, and to said sources of said seventh and eighth devices respectively, said sixth and seventh terminals being output terminals.

6. The high voltage output level shifter of claim 3, wherein said circuit comprises ninth, tenth and eleventh devices each having a source, a drain and a gate, said drain and said gate of said ninth device being coupled together and to said gate of said tenth device, said drain of said tenth device being coupled to said source of said eighth device, said gate of said tenth device being coupled to said second terminal, said source of said tenth device being coupled to said drain of said eleventh device, said source of said eleventh device being coupled to said third terminal, said gate of said eleventh device being coupled to said second output terminal of said input circuit.

7. The high voltage output level shifter of claim 3, further comprising a ninth device, having a gate, a drain and a source, said drain of said ninth device being coupled to said fourth terminal, said gate of said ninth device being coupled to said first output terminal of said input circuit and said source of said ninth device being coupled to said first terminal of said capacitor.

8. The high voltage output level shifter of claim 3, further comprising ninth and tenth devices, each having a gate, a drain and a source, said drain of said ninth device being coupled to said fourth terminal, said source of said ninth device being coupled to said first terminal of said capacitor, said gate of said ninth device being coupled to said drain of said tenth device, said source of said tenth device being coupled to said source of said eighth device, said gate of said tenth device being coupled to said second terminal.

9. The high voltage output level shifter of claim 3 further comprising a diode coupled between said first terminal and said gate of said fifth device, for limiting a maximum level of voltage at said sixth terminal.

10. The high voltage output level shifter of claim 2 wherein said input circuit comprises:

fifth and sixth devices of a first conductivity type, each having a drain, a source and a gate, said sources of said fifth and sixth devices being coupled together and to said second terminal, said gate of said fifth device being coupled to said drain of said sixth device, said gate of said sixth device being coupled to said drain of said fifth device, said source of said fifth device being coupled to a first output terminal;

seventh and eighth devices of a second conductivity type, each having a drain, a source and a gate, said drains of said seventh and eighth devices being coupled to said drains of said sixth and fifth devices respectively, said sources of said seventh and eighth devices being coupled to said third terminal, said drain of said seventh device being coupled to a second output terminal; and an inverter having an output and an input, said output being coupled to said gate of said eighth device, said input being coupled to said gate of said seventh device and to an input terminal.

11. The input circuit of claim 10, wherein the first conductivity type is a p-channel device and the second conductivity type is an n-channel device.

12. The high voltage output level shifter of claim 1 wherein said first voltage source is approximately 21 volts and wherein said third voltage source is approximately 0 volts.

13. The high voltage output level shifter of claim 1 wherein said second voltage source is approximately eleven volts.

14. In a circuit having a plurality of series devices, a method of distributing a voltage among a plurality of devices, the method comprising the steps of:

(a) providing a first terminal for coupling to a first voltage source, a second terminal for coupling to a second voltage source, a third terminal for coupling to a third voltage source, a fourth terminal for coupling to a clock signal, and an output terminal, wherein said second voltage source is intermediate to said first and third voltage sources;

(b) providing first, second, third and fourth devices, each having a source, a drain and a gate, said second device having a channel region between said source and drain of said second device, said second device having a field implant terminating short of said source and said drain of said second device, the field implant also terminating at the edge of said channel region, said drain of said first device being coupled to said first terminal, said source of said first device and said drain of said second device being coupled together, said source of said second device and said drain of said third device being coupled to said output terminal, said source of said third device and said drain of said fourth device being coupled together, said gate of said third device being coupled to said second terminal, said source of said fourth device being coupled to said third terminal;

(c) providing an input circuit for providing an input signal;

(d) providing a charge pump coupled to said input circuit and to said gates of said first and second devices for charging said gates of said first and second devices to a threshold voltage above that provided by said first voltage source in response to an input signal; and (e) providing a circuit coupled to said input circuit and to said gates of said third and fourth devices for switching said third and fourth devices off in response to said input signal.

15. The method of claim 14 wherein in step (c), said input circuit comprises first and second output terminals, said second output terminal providing a signal complementary to a signal provided by said first output terminal.

16. The method of claim 14 wherein in step (d), said charge pump comprises:

a fifth terminal for coupling to a fourth voltage source;

fifth, sixth, seventh and eighth devices each having a gate, a drain and a source, said drain of said fifth device being coupled to said fifth terminal, said source of said fifth device being coupled to said drain of said sixth device, said gate and said drain of said seventh device being coupled to said source of said sixth device, said source of said seventh device being coupled to said gate of said fifth device and to said gate of said first device, said gate and said drain of said eighth device being coupled to said source of said sixth device, said source of said eighth device being coupled to said gate of said sixth device and to said gate of said second device; and a capacitor having a first terminal and a second terminal, said first terminal of said capacitor being coupled to said fourth terminal and said second terminal of said capacitor being coupled to said gate and drain of said eighth device.

17. The method of claim 16, wherein in step (d), said sixth, seventh and eighth devices each has a channel region between said source and drain, and a field implant terminating short of said source and said drain, the field implant also terminating at the edge of said channel region.

18. The method of claim 17, further comprising the step of providing sixth and seventh terminals coupled to said gates of said first and second devices respectively, and to said sources of said seventh and eighth devices respectively, said sixth and seventh terminals being output terminals.

19. The method of claim 16, wherein in step (e), said circuit comprises ninth, tenth and eleventh devices each having a source, a drain and a gate, said drain and said gate of said ninth device being coupled together and to said gate of said tenth device, said drain of said tenth device being coupled to said source of said eighth device, said gate of said tenth device being coupled to said second terminal, said source of said tenth device being coupled to said drain of said eleventh device, said source of said eleventh device being coupled to said third terminal, said gate of said eleventh device being coupled to said second output terminal of said input circuit.

20. The method of claim 16, further comprising the step of providing a ninth device, having a gate, a drain and a source, said drain of said ninth device being coupled to said fourth terminal, said gate of said ninth device being coupled to said first output terminal of said input circuit and said source of said ninth device being coupled to said first terminal of said capacitor.

21. The method of claim 16, further comprising the step of providing ninth and tenth devices, each having a gate, a drain and a source, said drain of said ninth device being coupled to said fourth terminal, said source of said ninth device being coupled to said first terminal of said capacitor, said gate of said ninth device being coupled to said drain of said tenth device, said source of said tenth device being coupled to said source of said eighth device, said gate of said tenth device being coupled to said second terminal.

22. The method of claim 16 further comprising the step of providing a diode coupled between said first terminal and said gate of said fifth device, for limiting a maximum level of voltage at said sixth terminal.

23. The method of claim 15 wherein the step of providing an input circuit comprises the steps of:

providing fifth and sixth devices of a first conductivity type, each having a drain, a source and a gate, said sources of said fifth and sixth devices being coupled together and to said second terminal, said gate of said fifth device being coupled to said drain of said sixth device, said gate of said sixth device being coupled to said drain of said fifth device, said source of said fifth device being coupled to a first output terminal;

providing seventh and eighth devices of a second conductivity type, each having a drain, a source and a gate, said drains of said seventh and eighth devices being coupled to said drains of said sixth and fifth devices respectively, said sources of said seventh and eighth devices being coupled to said third terminal, said drain of said seventh device being coupled to a second output terminal; and providing an inverter having an output and an input, said output being coupled to said gate of said eighth device, said input being coupled to said gate of said seventh device and to an input terminal.

24. The method of claim 23, wherein in the step of providing said fifth and sixth devices, the first conductivity type is a p-channel device and wherein in the step of providing said seventh and eighth devices, the second conductivity type is an n-channel device.

25. The method of claim 14 wherein said first voltage source is approximately 21 volts and wherein said third voltage source is approximately 0 volts.

26. The method of claim 14 wherein said second voltage source is approximately eleven volts.

* * * * *